United States Patent [19]
Ohta et al.

[11] Patent Number: 5,645,974
[45] Date of Patent: Jul. 8, 1997

[54] PROCESS FOR THE PRODUCTION OF PRINTING PLATES

[75] Inventors: Katsuyuki Ohta, Atsugi; Toshiya Takagi; Toshimi Aoyama, both of Fujisawa, all of Japan

[73] Assignees: Tokyo Ohka Kogyo, K.K., Kanagawa, Japan; Ciba-Geigy Corporation, Tarrytown, N.Y.

[21] Appl. No.: 635,814

[22] Filed: Apr. 22, 1996

Related U.S. Application Data

[62] Division of Ser. No. 417,186, Apr. 5, 1995, Pat. No. 5,541,038, which is a continuation of Ser. No. 179,893, Jan. 10, 1994, abandoned, which is a continuation of Ser. No. 784,861, Oct. 30, 1991, abandoned.

[30] Foreign Application Priority Data

Nov. 5, 1990 [JP] Japan ................................ 2-297088

[51] Int. Cl.$^6$ .................................................. G03F 7/00
[52] U.S. Cl. ................... 430/306; 430/281.1; 430/916; 430/923; 522/8; 522/49; 522/50
[58] Field of Search ................... 430/306, 281.1, 430/916, 923; 522/8, 49, 50

[56] References Cited

U.S. PATENT DOCUMENTS

| 4,287,367 | 9/1981 | Kuesters et al. .......................... 568/43 |
| 4,935,330 | 6/1990 | Hofmann et al. ....................... 430/281 |
| 5,077,402 | 12/1991 | Desobry et al. .......................... 544/87 |

FOREIGN PATENT DOCUMENTS

| 0085031 | 8/1983 | European Pat. Off. . |
| 0137228 | 4/1985 | European Pat. Off. . |
| 0234570 | 9/1987 | European Pat. Off. . |
| 0284561 | 9/1988 | European Pat. Off. . |

OTHER PUBLICATIONS

C. G. Roffey, Photopolymerization of Surface Coating, Wiley, NY. 1982, pp. 82–83.

*Primary Examiner*—George F. Lesmes
*Assistant Examiner*—Laura Weiner
*Attorney, Agent, or Firm*—David R. Crichton

[57] ABSTRACT

Compositions comprising a linear base polymer, an ethylenically unsaturated addition-polymerizable compound and a combination of (A) a 1-benzoyl-1-amino-substituted-1-benzylalkane with (B) an $\alpha$-phenyl-$\alpha,\alpha$-dialkoxyacetophenone as photopolymerization initiator are suitable for the production of thick-film printing plates.

15 Claims, No Drawings

PROCESS FOR THE PRODUCTION OF PRINTING PLATES

This is a DIVISIONAL of application Ser. No. 08/417,186 filed Apr. 5, 1995 now U.S. Pat. No. 5,541,038 which is a CONTINUATION of application Ser. No. 08/179,893 filed Jan. 10, 1994 now abandoned which is a CONTINUATION of application Ser. No. 07/784,861 filed Oct. 30, 1991 now abandoned.

This invention relates to novel photopolymerizable compositions, more particularly to photopolymerizable compositions having high sensitivity, which can suitably be used for thick-film photosensitive printing plates.

With the rapid development of printing technique, photosensitive printing plate materials have recently been developed, and they are used widely in place of conventional stereotype, metal plate and rubber plate in such fields, for example, as newspaper printing, business form printing, page printing (magazines and books), seal and label printing and commercial printing including catalogs and posters or flexographic printing on canons etc., as well as, seal and stamp manufacturing, since photosensitive printing plate materials have excellent features of facilitating speedy printing and improving not only appearance of the printed matters but also economical efficiency and working environment.

Various types of photosensitive printing plate materials are known including, for example, for relief printing plates pre-sensitized (PS) relief printing plates, PS planographic printing plates and flexographic printing plates. In the process of the first mentioned relief printing plate, a thick-film negative type photosensitive printing plate material usually comprising a substrate having a coating of photopolymerizable composition is used, which can be processed by irradiating an activation my such as of ultraviolet through an image carrier such as a negative film to form an image thereon, and by removing the unirradiated portions selectively with a developing solution (etching), followed by drying and post irradiation treatment.

While the photopolymerizable composition used in the above process usually comprises essentially a linear base polymer, an ethylenically unsaturated addition-polymerizable compound and a photopolymerization initiator, it is necessary for the relief printing plate material to have a film thickness of about 0.4 to 7 mm, so that an excess of activation ray must be irradiated onto a negative type photosensitive printing plate material so as to reach the bottom of the film, because absorption of the activation ray or desensitization by oxygen occurs. Irradiation of the excess of activation ray, however, will bring about excessive irradiation dose on the surface layer and in turn reduced definition, since even the unirradiated portions are brought into exposure to the activation ray due to the phenomenon of activation ray diffraction, resulting in the difficulty in obtaining a printing plate with a desired pattern.

The 1-benzoyl-1-(substituted amino)-1-benzylalkanes are for example described in EP-A-284,561. α-Phenyl-α,α-dialkoxyacetophenones are, for example, known from U.S. Pat. No. 4,287,367 or EP-A-85,031.

Conventional photopolymerization initiators include those compounds which generate radicals under the action of the activation ray, for example, benzoins such as benzoin, benzoin methyl ether and benzoin ethyl ether; 1,2-dicarbonyl ketals such as benzildimethyl ketal and α,α-diethoxyacetophenone; aromatic ketones such as benzophenone, Michler's ketone and thioxanthone; quinones such as anthraquinone and phenanthrenequinone; and halogen compounds such as α,α-dichloro-4-phenoxyacetophenone, α,α,α-trichloro-4-t-butylacetophenone and 2,4-bis(trichloromethyl)-6-phenyl-sym-triazine. Various attempts have also been made to use these initiators in combination (two or more) or with photosensitizers.

However, no photopolymerizable composition having high sensitivity, which can yield sufficient definition in making thickfilm printing plates with no handling trouble as described above has so far been found.

This invention has been accomplished for the purpose of overcoming the disadvantages inherent in the conventional photopolymerizable compositions and providing a photopolymerizable composition having so high sensitivity as to give sufficient definition in making a thick-film photosensitive printing plate.

This invention is directed to a photopolymerizable composition comprising a linear base polymer, an ethylenically unsaturated addition-polymerizable compound and a photopolymerization initiator; characterized in that said photopolymerization initiator comprises a combination of (A) a 1-benzoyl-1-(substituted amino)-1-benzylalkane or 1-benzoyl-1-(substituted amino)-1-allylalkane and (B) an α-phenyl-α,α-dialkoxyacetophenone or α,α-dialkoxyacetophenone.

The linear base polymer to be used according to this invention can arbitrarily be selected from those which are conventionally used for forming matrix resins in the conventional photosensitive resins, and it includes water-soluble resins such as polyvinyl alcohol; polyamides soluble in water or alcohols; copolymers using terephthalic aicd, isophthalic acid, sebacic acid, adipic acid or hexahydroterephthalic acid; polyimide, vinylidene chloride copolymers, ethylene/vinyl acetate copolymers, cellulose ethers, polyethylene, synthetic rubbers, cellulose esters, polyvinyl acetate/alkyl acrylates, polyvinyl acetate/alkyl methacrylates, polyalkyl acrylates, poly-α-alkyl acrylates, high molecular weight polyethylene oxides, polyvinyl chloride and copolymers thereof, polyvinyl acetal, polyformaldehyde, polyurethane, polycarbonate and polystyrene. These organic high molecular polymers can be used singly or two or more of them can be used in combination.

The ethylenically unsaturated addition-polymerizable compound to be used in combination with the linear base polymer can also arbitrarily be selected from those which are customarily used as a constituent of such photosensitive resin compositions.

Such additon-polymerizable compound can be exemplified by acrylic or methacrylic acid esters of polyhydric alcohols, glycerol diacrylate or dimethacrylate, diethylene glycol monoacrylate or monomethacrylate, diethylene glycol diacrylate or dimethacrylate, triethylene glycol diacrylate or dimethacrylate, hexanediol diacrylate or dimethacrylate, trimethylol propane triacrylate or trimethacrylate, pentaerythritol triacrylate or trimethacrylate, pentaerythritol tetraacrylate or tetramethacrylate; adducts of epoxy compounds with acrylic acid or methacrylic acid; adducts of compounds having carboxyl groups with glycidyl acrylate or glycidyl methacrylate; adducts of compounds having primary or secondary amino group with glycidyl acrylate or glycidyl methacrylate; acrylamide compounds such as acrylamide, methacrylamide, methylenebisacrylamide, methylenebismethacrylamide, diacetone acrylamide and triacrylformal; and unsaturated urethane compounds to be obtained through addition reaction between ethylenically unsaturated compounds having hydroxyl groups and isocyanate compounds. These addition-polymerizable compounds can be used singly or two or more of them may be used in combination.

When a composition which substantially assumes a non fluid form at normal temperature is to be formed, it is advantageous to use an addition-polymerizable compound, which has a boiling point of about 100° C. or more under atmospheric pressure.

It is essential in this invention to use the combination off
(A) a 1-benzoyl-1-(substituted amino)-1-benzylalkane or 1-benzoyl-1-(substituted amino)-1-allylalkane and
(B) an α-phenyl-α,α-dialkoxyacetophenone or α,α-dialkoxyacetophenone.

Preferred compositions are those, wherein
(A) is a compound of formula I

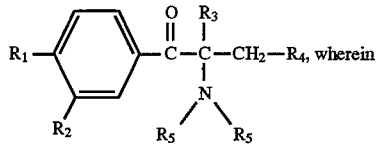

$R_1$ and $R_2$ independently of one another are hydrogen, $C_1$–$C_4$-alkyl, $C_1$–$C_4$-alkoxy, halogen or a group —$N(R_6)_2$,
$R_3$ is $C_1$$C_8$-alkyl,
$R_4$ is vinyl, phenyl or phenyl substituted by one to three $C_1$–$C_{12}$alkyl, $C_1$–$C_4$-alkoxy or halogen,
$R_5$ and $R_6$ independently of one another are $C_1$–$C_4$-alkyl or both $R_5$ or both $R_6$ together with the nitrogen atom, to which they are bonded, form a 5- or 6-membered saturated or unsaturated ring, which may be interrupted by —O— or —N(CH$_3$)—,
(B) is a compound of formula

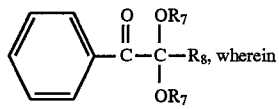

$R_7$ is unsubstituted $C_1$–$C_8$alkyl or $C_1$–$C_8$alkyl substituted by $C_1$–$C_4$-alkoxy,
$R_8$ is hydrogen or phenyl.

$C_1$–$C_4$-alkyl $R_1$, $R_2$, $R_5$ and $R_6$ are linear or branched, for example methyl, ethyl, n-propyl, i-propyl, n-butyl, s-butyl or t-butyl, preferably methyl.

$C_1$–$C_8$-alkyl $R_3$ additionally to the examples given for $R_1$, $R_2$, $R_5$ and $R_6$ is, for example, pentyl, hexyl, heptyl, 4-dimethyl-1-methyl-but-1-yl or octyl, preferably ethyl, hexyl or 4-dimethyl-1-methyl-but-1-yl, most preferably is $C_1$–$C_8$-alkyl $R_3$ ethyl.

$R_1$ and $R_2$ as $C_1$–$C_4$-alkoxy, for example, are methoxy, ethoxy, propyloxy and butoxy, preferably methoxy.

Halogen $R_1$ and $R_2$ is fluoro, chloro or bromo, preferred is chloro.

If both $R_5$ or both $R_6$ together with the nitrogen atom, to which they are bonded, form a 5- or 6-membered saturated or unsaturated ring, they are, for example, pyrrolidinyl, pyrrodyl, piperidinyl or pyridinyl, preferably pyrrolyl.

If the ring formed by both $R_5$ or both $R_6$ together with the nitrogen atom, to which they are bonded, is interupted by —O— it is, for example, morpholino.

$R_4$ as phenyl substituted with alkyl, alkoxy or halogen, for example are tolyl, xylyl, mesityl, ethylphenyl, methoxyphenyl, dimethoxyphenyl, 3,4-dimethoxyphen-1-yl, chlorophenyl or dichlorophenyl.

$R_7$ as $C_1$–$C_8$-alkyl substituted by $C_1$–$C_4$-alkoxy, for example is methoxymethyl, methoxyethyl, ethoxymethyl, ethoxyethyl, preferably methoxyethyl.

$R_1$ preferably is —$N(R_6)_2$, methoxy or hydrogen, most preferably $R_1$—$N(R_6)_2$.

$R_2$ preferably is hydrogen or methoxy, especially hydrogen.

$R_3$ preferably is ethyl, hexyl or 4-dimethyl-1-methyl-but-1-yl, especially ethyl.

$R_4$ preferably is phenyl.

$R_5$ preferably is methyl or both $R_5$ together with the nitrogen atom, to which they are bonded, are morpholino, especially $R_5$ is methyl.

$R_6$ preferably is methyl or both $R_5$ together with the nitrogen atom, to which they are bonded, are pyrrolyl or morpholino, especially morpholino.

$R_7$ preferably is methyl, ethyl or 1-methyl-prop-1-yl, especially methyl.

$R_8$ preferably is phenyl.

Compound (A) can be exemplified by 1-(4-dimethylaminobenzoyl)-1-dimethylamino-1-benzylpropane, 1-(4-morpholinobenzoyl)-1-dimethylamino-1-benzylpropane, 1-(4-morpholinobenzoyl)-1-dimethylamino-1-benzylheptane, 1-(4-dimethylaminobenzoyl)-1-dimethylamino-1-benzyl-2,4,4-trimethylpentane, 1-(4-pyrrolidinobenzoyl)-1-dimethylamino-1-benzylpropane, 1-(3-methoxy-4-dimethylaminobenzoyl)-1-dimethylamino-1-benzylpropane, 2-benzyl-2-dimethylamino-1-phenyl-butan-1-one, 2-benzyl-2-dimethylamino-1-(4-methoxyphenyl)-butan-1-one, 2-benzyl-2-dimethylamino-1-(4-methylphenyl) -butan-1-one, 2-benzyl-2-dimethylamino-1-(3,4-dimethoxyphenyl)-butan-1-one and 1-(4-dimethylaminobenzoyl)-1-morpholino-1-benzylpropane, preferred are 1-(4-morpholinobenzoyl)-1-dimethylamino-1-benzylpropane and 2-benzyl-2-dimethylamino-1-(3,4-dimethoxyphenyl)-butan-1-one, particularly 1-(4-morpholinobenzoyl)-1-dimethylamino-1-benzylpropane.

Other Examples for compounds (A) are given in EP-A-284,561.

Compound (B) can be exemplified by α,α-dimethoxy-α-phenylacetophenone, α,α-diethoxy-α-phenylacetophenone, α,α-di-(1-methylpropoxy)-α-phenylacetophenone and α,α-di(2-methoxyethoxy)-α-phenylacetophenone, particularly preferred of all is α,α-dimethoxy-α-phenylacetophenone.

The preparation of the compounds (A) and (B) is known and described for example in U.S. Pat. No. 4,287,367 (B), EP-A-85,031 (B) and EP-A-284,561 (A).

Especially suitable is a composition, wherein in formula I, $R_4$ is phenyl.

Important are those compositions, wherein in formula I, $R_1$ is hydrogen, methyl, methoxy or a group —$N(R_6)_2$, $R_2$ is hydrogen or methoxy, $R_5$ is methyl or both $R_5$, together with the nitrogen atom, to which they are bonded and a further O-atom, form a morpholino-ring and $R_6$ is methyl or both $R_6$, together with the nitrogen atom, to which they are bonded and a further O-atom, form a morpholino-ring, or both $R_6$, together with the nitrogen atom, to which they are bonded, form a pyrrolidino-ring.

Further preferred is a composition as described above, wherein $R_1$ is hydrogen, methyl or methoxy, $R_3$ is ethyl and $R_5$ is methyl.

Of importance is also a composition, wherein $R_1$ is —$N(R_6)_2$.

Especially preferred is a composition, wherein both $R_6$, together with the nitrogen atom, to which they are bonded and a further O-atom, form a morpholino-ring.

Most suitable is a composition, wherein, in formula II $R_8$ is phenyl.

Preferred is a composition, wherein, in formula II $R_8$ is phenyl and $R_7$ is methyl.

The compounds represented by the general formulae (I) and (II) may be used singly or as a combination of two or more of them, respectively, and the mixing ratio of the compound of the general formula (I) to the compound of the general formula (II) is usually in the range of 1:10 to 10:1, preferably 1:5 to 5:1 in terms of molar ratio. If these compounds (I) and (II) are used at a ratio departing from this range, the resulting photopolymerizable composition can hardly demonstrate high sensitivity or high polymerizability, and the intended object of this invention cannot sufficiently be attained.

The present composition can, for example, contain other conventional photopolymerization initiators, as necessary, in addition to the compounds of the general formula (I), (Ia) and (II). Such conventional initiators include, for example, benzoin, benzoin methyl ether, benzphenone, Michler's ketone, thioxanthone, 1-hydroxycyclohexyl-phenyl-ketone, 2-hydroxy-2-methyl-propiophenone, $[(\eta^6\text{-cumene}) (\eta^5\text{-cyclopentadienyl})\text{iron}]^{\oplus}.\text{hexafluoro phosphate}^{\ominus}$ and 2-methyl-[4-(methylthio)phenyl]-2-morpholinopropan-1-one. The conventional photopolymerization initiators to be additionally used in the compositions of the present invention are normally used in an amount not exceeding 30% by weight of the total photopolymerization initiators. If the amount of such additional photopolymerization initiator exceeds this range, sufficient sensitivity may not practically be exhibited, when the resulting photopolymerizable composition is used as a thick film.

In the present composition, the total amount of the photopolymerization initiators is, for example, usually selected from the range of 0.05 to 20% by weight, preferably 0.1 to 10% by weight, based on the total amount of the present composition. If the total amount of the photopolymerization initiators is less than 0.05% by weight, the amount of the radicals for initiating polymerization of the ethylenically unsaturated compound to be generated upon irradiation with an activation ray, such as of ultraviolet, will be too small, and thus the polymerization reaction is liable to proceed with difficulty. On the other hand, if said total amount is more than 20% by weight, the internal portion of the film is insufficiently cured or sensitivity of the film is liable to be reduced.

The amount of the ethylenically unsaturated addition-polymerizable compound is usually in the range of 2 to 300 parts by weight, preferably 5 to 200 parts by weight per 100 parts by weight of the linear base polymer. If it is used in an amount of less than 2 parts by weight, the resulting film unfavorably comes to have low photocrosslinking density, reduced photosensitivity, low developability due to the small solubility difference between the exposed portions and the unexposed portions in the developing solution, or low mechanical strength after curing. If it is used in an amount of more than 300 parts by weight, the resulting film will find difficulty in retaining integrity as a solid plate.

The composition of this invention is prepared by dissolving the linear base polymer, ethylenically unsaturated addition-polymerizable compound, photopolymerization initiators and other additive components, which are employed as necessary, in a sufficient amount of solvent and casting the resulting solution by conventional procedure, followed by drying; or by mixing them mechanically, to form a predetermined thickness of film. The solvent suitably used for such purpose includes water, alcohols and ketones.

It is frequently customary to add further additives, for example thermal inhibitors, which are intended to protect against premature polymerization, particularly during preparation of the compositions by mixing the components. To this end, hydroquinone, hydroquinone derivatives, p-methoxyphenol, β-naphthols or sterically hindered phenols, for example 2,6-di(tert-butyl)-p-cresol, art used for example. Furthermore, small amounts of UV absorbers may be added, for example those of the benzotriazole, benzophenone or oxalanilide type. It is also possible to add light screens of the sterically hindered amine type (HALS).

In order to increase the stability on storage in the dark, copper compounds, such as copper naphthenate, stearate or octanoate, phosphorus compounds, such as triphenylphosphine, tributylphosphine, triethyl phosphite, triphenyl phosphite or tribenzyl phosphite, quaternary ammonium compounds, such as tetramethylammonium chloride or trimethylbenzylammonium chloride, or hydroxylamine derivatives, for example N-diethylhydroxylamine, may be added.

In order to exclude the inhibiting effect of atmospheric oxygen, paraffin or similar waxy substances are frequently added to photocurable mixtures. Due to low solubility in the polymer, these float at the beginning of the polymerization and form a transparent surface layer which prevents ingress of air.

Further customary additives are photosensitizers, which absorb in certain wavelengths and pass the absorbed energy to the initiators or themselves function as an additional initiator. Examples of these are, in particular, thioxanthone, anthracene, anthraquinone and coumarine derivatives.

Further customary additives are accelerators of the amine type, which are particularly important in pigmented preparations since they act as chain-transfer agents. Examples of these are N-methyldiethanolamine, triethylamine, ethyl p-dimethylaminobenzoate or Michler's ketone. The action of the amines can be reinforced by adding aromatic ketones of the benzophenone type. Further customary accelerators are 1,3,4-thiadiazole derivatives, for example 2-mercapto-5-methylthio-1,3,4-thiadiazole.

Examples of further customary additives are fillers, pigments, dyes, adhesives, wetting agents and flow-control agents.

As already mentioned above, the compositions of the present invention are used for the production of thick-film printing plates.

To describe a preferred embodiment of using the present composition, the present composition is first extruded from an extruder and the like and cast onto a metal plate for example of iron or aluminium, or a plastic sheet, for example of polyester, to form a predetermined thickness of film. The thus formed film is dried in a dryer to prepare a photosensitive printing plate material. The resulting photosensitive printing plate material is irradiated with an ultraviolet ray on the photosensitive layer through a predetermined masking pattern using an ultraviolet emitting low-pressure mercury lamp, high pressure mercury lamp or fluorescent lamp as a light source. Since the portions irradiated with the ultraviolet ray undergo curing through photopolymerization reaction, the unirradiated portions are removed by dissolving with a developing solution to complete the desired printing plate.

A further object of the invention is a process for the production of printing plates by imagewise irradiation with light in the range 200–600 nm of a layer, which is applied to a base and consists of a composition as described above and subsequent removal of the unexposed parts of the layer.

The photopolymerizable composition of this invention characteristically employing the combination of the specific compounds as photopolymerization initiators, is useful as a photosensitive printing plate material fording improved productivity because of its high sensitivity, which has never been achieved in the conventional photopolymerizable compositions. The present composition can also suitably be used, for example, as a dry film when printed wiring boards manufactured, using a thick film of photopolymerizable compositon likewise.

This invention is described in more detail by way of nonlimitative examples.

EXAMPLE 1

| | |
|---|---|
| Polystyrene/polybutadiene/polystyrene block copolymer (®TUFPRENE, manufactured by Asahi Chemical Industry Co., Ltd.) | 100 parts by weight |
| Polybutadiene; molecular weight: 1000 (®NISSO PB B 700; manufactured by Nippon Soda Co., Ltd.) | 50 parts by weight |
| Trimethylolpropane triacrylate | 10 parts by weight |
| Photopolymerization initiators (as shown in Table) | 3 parts by weight |
| 2,6-Dibutyl-4-methylphenol | 0.05 parts by weight |
| Methyl ethyl ketone | 100 parts by weight |

The above formulation is stirred in a flask under refulxing conditions for about 2 hours to dissolve the solid contents. The so prepared photopolymerizable composition is spread on a 100 μm-thick polyester sheet (base film), having an adhesive layer, in a way, that the dry film thickness is 2.74 mm. The film is dried at 60° C. for 12 hours. Subsequently, a sheet comprising a 100 μm-thick polyester sheet coated with an alcohol-soluble polyamide (®MACROMELT 6900, manufacutred by Henkel), having a dry film thickness of 5 μm, is laminated onto the top surface of the previously formed film to provide a photosensitive printing plate material. The thus obtained plate material is irradiated over the entire surface from the side of the base film with an ultraviolet ray using a fluorescent lamp (FL, 40 BL, manufactured by Toshiba Corporation) at the distance of 2 cm for 1.5 minutes. The other side of polyester sheet is then peeled off, and a standardized test negative with 21 optical density steps (STEP TABLET No. 2 manufactured by Kodak) and a test chart mask are superposed closely thereon under reduced pressure. The resulting laminate is irradiated with an ultraviolet ray for 15 minutes using the same fluorescent lamp as described above and then subjected to development for 10 minutes with a developing solution comprising trichloroethane/butyl alcohol (3:1; weight ratio) in a brush type dissolving machine (Cyrel Processor, manufactured by DuPont). The developing step is followed by drying at 40° C. for 1 hour to complete the printing plate.

The following table 1 shows the sensitivity of the thus obtained printing plates by the step number of the Kodak STEP TABLET. The higher the number of steps, the better is the sensitivity of the printing plate.

The image resolution capability is determined by the smallest attainable % screen dot (tonal value) at 133 lines/inch (completely reproduced portion) on the specific test chart mask. The reproductivity results are given in table 1, too. The lower the reproductivity value, the better is the resolution of the image.

TABLE 1

| Photopolymerization initiator (part by weight) | Sensitivity (number of steps) | Reproductivity (%) |
|---|---|---|
| (A-1) 1.5 (B) 1.5 | 16 | 3 |
| (A-1) 1.0 (B) 2.0 | 16 | 3 |
| (A-1) 2.0 (B) 1.0 | 16 | 3 |
| (A-1) 2.5 (B) 0.5 | 15 | 3 |
| (A-1) 0.5 (B) 2.5 | 15 | 3 |
| (A-2) 1.5 (B) 1.5 | 15 | 4 |
| (A-3) 1.5 (B) 1.5 | 15 | 4 |
| (A-1) 3 | 14 | 5 |
| (A-2) 3 | 14 | 5 |
| (A-3) 3 | 14 | 5 |
| (B) 3 | 14 | 4 |

(A-1): 1-(4-Morpholinobenzoyl)-1-dimethylamino-1-benzylpropane
(A-2): 2-benzyl-2-dimethylamino-1-(4-methoxyphenyl)-butane-1-one
(A-3): 2-benzyl-2-dimethylamino-1-(3,4-dimethoxyphenyl)-butane-1-one
(B): α,α-Dimethoxy-α-phenylacetophenone

EXAMPLE 2

A plate formulation as described in example 1, is placed in a glass beaker and irradiated by a fluorescent lamp (FL 40 BL, manufactured by Toshiba Corporation) positioned 2 cm above the surface for 3 minutes. Then this formulation is developed as described in example 1 by washing out the uncured portions. The thickness of the remaining solidified section is measured.

The results are given in table 2.

TABLE 2

| Photopolymerisation-initiator (parts by weight) | Cure Depth after 3 min (mm) |
|---|---|
| (B) 2 (A-3) 1 | 2.7 |
| (B) 1 (A-3) 2 | 2.7 |
| (B) 3 (A-3) 3 | 2.5 2.6 |

(B): α,α-Dimethoxy-α-phenylacetophenone
(A-3): 2-benzyl-2-dimethylamino-1-(3,4-dimethoxyphenyl)-butane-1-one

What is claimed is:

1. A process for the production of printing plates by imagewise irradiation with light in the range 200–600 nm comprising the steps of: applying to a base a layer of photopolymerizable composition comprising a linear base polymer, an ethylenically unsaturated addition-polymerizable compound and a photopolymerization initiator; characterized in that said photopolymerization initiator comprises a combination of the following components (A) and (B) wherein (A) is a compound of formula I

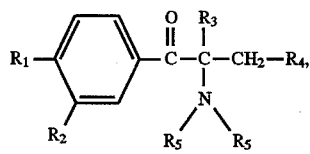

wherein $R_1$ and $R_2$ independently of one another are hydrogen, $C_1$–$C_4$-alkyl, $C_1$–$C_4$-alkoxy, halogen or a group —$N(R_6)_2$, $R_3$ is $C_1$–$C_8$-alkyl, $R_4$ is phenyl, $R_5$ and $R_6$ independently of one another are $C_1$–$C_4$-alkyl or both $R_5$ or both $R_6$ together with the nitrogen atom, to which they are bonded, form a 5- or 6-membered saturated or unsaturated ring, which may be interrupted by —O— or —$N(CH_3)$— and;

(B) is a compound of formula II

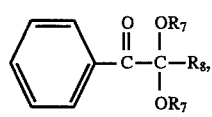

wherein $R_7$ is $C_1$–$C_8$-alkyl, phenyl or $C_1$–$C_8$-alkyl substituted by $C_1$–$C_4$-alkoxy, $R_8$ is phenyl, wherein (A) and (B) are present in the photopolymerizable composition in an amount effective to give sufficient sensitivity for the production of thick-film printing plates;

exposing selected portions of the layer to irradiation and subsequently removing unexposed parts of the layer.

2. The process of claim 1, wherein, in formula I, $R_1$ is hydrogen, methyl, methoxy or a group —$N(R_6)_2$, $R_2$ is hydrogen or methoxy, $R_5$ is methyl or both $R_5$, together with the nitrogen atom, to which they are bonded and a further O-atom, form a morpholino-ring and $R_6$ is methyl or both $R_6$, together with the nitrogen atom, to which they are bonded and a further O-atom, form a morpholino-ring, or both $R_6$, together with the nitrogen atom, to which they are bonded, form a pyrrolidino-ring.

3. The process of claim 2, wherein $R_1$ is hydrogen, methyl or methoxy, $R_3$ is ethyl and $R_5$ is methyl.

4. The process of claim 2, wherein $R_1$ is —$N(R_6)_2$.

5. The process of claim 4, wherein both $R_6$, together with the nitrogen atom, to which they are bonded and a further O-atom, form a morpholino-ring.

6. The process of claim 1, wherein, in formula II, $R_7$ is methyl.

7. The process of claim 1, wherein the molar ratio of compound (A): compound (B) is from 1:10 to 10:1.

8. The process of claim 7, wherein the molar ratio of compound (A): compound (B) from 1:5 to 5:1.

9. The process of claim 1, wherein the amount of the photoinitiator component is from 0.05 to 20% by weight.

10. The process of claim 9, wherein the amount of the photoinitiator component is from 0.1 to 10% by weight.

11. The process of claim 1, containing an additional photoinitiator.

12. The process of claim 1, wherein the amount of the ethylenically unsaturated addition-polymerizable compound is from 2 to 300 parts by weight referring to 100 parts by weight of the linear base polymer.

13. The process of claim 12, wherein the amount of the ethylenically unsaturated addition-polymerizable compound is from 5 to 200 parts by weight, referring to 100 parts by weight of the linear base polymer.

14. The process according to claim 1, wherein the amount of the ethylenically unsaturated addition-polymerizable compound is from 5 to 200 parts by weight referring to 100 parts by weight of the linear base polymer.

15. An improved process for the production of printing plates by imagewise irradiation with light in the range 200–600 nm including the steps of applying a layer of photopolymerizable composition to a base, exposing selected portions of the layer to irradiation and subsequently removing unexposed parts of the layer, the improvement comprising using a photopolymerizable composition comprising a linear base polymer, an ethylenically unsaturated addition-polymerizable compound and a photopolymerization initiator; characterized in that said photopolymerization initiator comprises a combination of the following components (A) and (B) wherein (A) is a compound of formula I

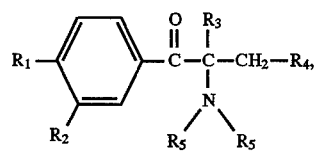

wherein $R_1$ and $R_2$ independently of one another are hydrogen, $C_1$–$C_4$-alkyl, $C_1$–$C_4$-alkoxy, halogen or a group —$N(R_6)_2$, $R_3$ is $C_1$–$C_6$-alkyl, $R_4$ is phenyl, $R_5$ and $R_6$ independently of one another are $C_1$–$C_4$-alkyl or both $R_5$ or both $R_6$ together with the nitrogen atom, to which they are bonded, form a 5- or 6-membered saturated or unsaturated ring, which may be interrupted by —O— or —$N(CH_3)$— and;

(B) is a compound of formula II

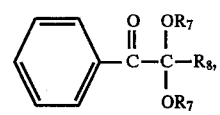

wherein $R_7$ is $C_1$–$C_8$-alkyl, phenyl or $C_1$–$C_8$-alkyl substituted by $C_1$–$C_4$-alkoxy, $R_8$ is phenyl, wherein (A) and (B) are present in the photopolymerizable composition in an amount effective to give sufficient sensitivity for the production of thick-film printing plates.

* * * * *